United States Patent [19]

Mine et al.

[11] Patent Number: 4,721,994
[45] Date of Patent: Jan. 26, 1988

[54] LEAD FRAME FOR SEMICONDUCTOR DEVICES

[75] Inventors: Katsutoshi Mine; Kazumi Nakayoshi, both of Chiba, Japan

[73] Assignee: Toray Silicone Co., Ltd., Tokyo, Japan

[21] Appl. No.: 873,577

[22] Filed: Jun. 12, 1986

[30] Foreign Application Priority Data

Jun. 25, 1985 [JP] Japan .................. 60-138821

[51] Int. Cl.[4] .............. H01L 23/50; B32B 15/08; C09J 3/12; C09J 5/06
[52] U.S. Cl. .................. 357/70; 428/450; 428/458; 156/329
[58] Field of Search ............ 357/70, 80; 156/329; 428/450, 458

[56] References Cited

U.S. PATENT DOCUMENTS

| | | | |
|---|---|---|---|
| 3,763,404 | 10/1973 | Aird | 357/70 |
| 4,063,993 | 12/1977 | Burns | 29/846 |
| 4,089,733 | 5/1978 | Zimmerman | 357/70 |
| 4,204,317 | 5/1980 | Winn | 357/70 |
| 4,332,844 | 6/1982 | Hamada et al. | 428/450 |
| 4,339,486 | 7/1982 | Shimamoto et al. | 156/329 |

FOREIGN PATENT DOCUMENTS

| | | | |
|---|---|---|---|
| 58-178544 | 10/1983 | Japan | 357/70 |
| 2140205 | 11/1984 | United Kingdom | 357/70 |

Primary Examiner—Andrew J. James
Assistant Examiner—John Lamont
Attorney, Agent, or Firm—Robert Spector

[57] ABSTRACT

This invention provides a semiconductor device lead frame comprising a mounting tab for a semiconductor chip located within the lead frame and multiple inner leads extending to the area adjacent to the perimeter of the tab. The configuration of the inner leads with respect to one another and the mounting tab is stabilized by adhering at least a portion of the leads and, optionally, the mounting tab to a dielectric film coated on one side with a cured, heat-activated silicone adhesive.

9 Claims, 5 Drawing Figures

LEAD FRAME FOR SEMICONDUCTOR DEVICES

BACKGROUND OF THE INVENTION

1. Field of the Invention

This invention relates to semiconductor devices. More particularly, this invention relates to lead frames for mounting semiconductor chips that reduce the likelihood of bonding failures during fabrication of the devices.

2. Description of the Prior Art

Lead frames for semiconductor devices typically comprise a tab for mounting a semiconductor chip and a plurality of inner leads extending inwardly from the perimeter of the frame to an area immediately adjacent to the perimeter of the tab. The tab is typically located within the body of the lead frame and is secured to the perimeter of the frame by at least one supporting member. During fabrication of a semiconductor device the tips of the inner leads are connected to electrodes on the semiconductor chip by means of fine metal wires, following which the chip, tab and inner leads are encapsulated within a synthetic resin, a ceramic material, or a combination of a glass and a ceramic material. Semiconductor devices that can be fabricated in this manner include various types of integrated circuits.

Prior art lead frames suffer from a number of shortcomings. As the number of inner leads has been increased from 16 to 32 to 64, the width of these leads has usually been reduced. As the circumference of the lead frame is increased, the inner leads are correspondingly lengthened. These modifications have caused the inner leads to become weaker and easier to deform, to the extent that they can be bent by the vibrations experienced during transport of the lead frame. This problem has been further compounded by a reduction in lead frame thickness. A bent or dislocated inner lead increases the difficulty of bonding the lead to the find bonding wire connecting the lead to an electrode on the semiconductor chip, resulting in more frequent bonding failures and undesirable contact between adjacent bonding wires and/or inner leads.

Solutions that have been proposed to remedy the aforementioned shortcomings include stabilizing the configuration of the inner leads by adhering at least a portion of the leads to a strip of pressure-sensitive dielectric tape or adhering an edge of the mounting tab and the tips of at least some of the inner leads to a dielectric film adhered using a liquid adhesive. These solutions have been proposed in Japanese Patent Publications (Kokai) Nos. 58(83)/161,439, 58(83)/143,541 and 58(83)/182,859.

Use of a dielectric pressure-sensitive tape to immobilize the inner leads is less than satisfactory because the pressure-sensitive adhesive is softened by the high temperatures used in die bonding or wire bonding. The tape then slips or peels with the result that wire bonding to the leads is made difficult.

Lead frames in which the inner leads and tab surface are bonded to an insulating film using a liquid adhesive are less than satisfactory. The adhesive can be squeezed out during the bonding operation, thereby contaminating the wire bond and complicating the production process.

An objective of the present invention is to eliminate the problems associated with prior art lead frames by providing a lead frame for semiconductor devices in which the inner leads are immobilized, the wire bonding operation is simplified and failures to properly connect the semiconductor to the inner leads are infrequent.

SUMMARY OF THE INVENTION

The objectives of this invention are achieved by providing a semiconductor device lead frame which comprises a mounting tab for a semiconductor chip located within the lead frame and multiple inner leads extending to the area adjacent to the perimeter of said tab, wherein the configuration of the inner leads with respect to one another and the mounting tab is stabilized using a heat-resistant resin film which has been coated on one side with a cured heat-activated silicone adhesive.

DETAILED DESCRIPTION OF THE INVENTION

Figure 1:
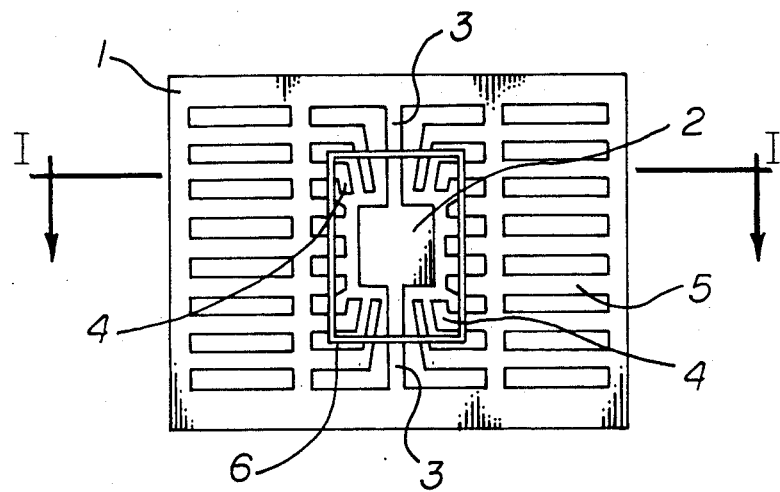
FIG. 1 is a top view of a lead frame that represents one embodiment of the present invention.

This invention provides a lead frame for a semiconductor device comprising a mounting tab for a semiconductor chip located within the body of said frame, at least one supporting member extending from the body of said tab to the perimeter of said frame, a plurality of inner leads extending from the perimeter of said frame inwardly to the area immediately adjacent to the perimeter of said tab, and means for stabilizing the configuration of said inner leads with respect to one another and with respect to said tab during installation of said chip, said means consisting essentially of a heat resistant, dielectric film that is bonded to at least a portion of said inner leads or to the tips of said leads and said tab by a heat cured silicone adhesive.

The shape, size, thickness and material of the present lead frames are not critical so long as multiple outer and inner leads extend inwardly from the perimeter of the frame to an area adjacent to the tab on which a semiconductor chip is to be mounted. However, lead frames made of metal, which are thin and which possess a large number of inner leads, and particularly long inner leads, are most suitable for the present invention. A heat-resistant resin film laminated with a cured heat-activated silicone adhesive serves as the medium to which at least a portion of the inner leads, and, optionally, the mounting tab are adhered to immobilize them. The type of film is not critical so long as it is a laminate, and preferably a unified laminate, of a cured, hrat-activated silicone adhesive applied to one surface of a heat-resistant dielectric resin film. Suitable silicone materials include rubbers, gels and resins. Suitable dielectric films are exemplified by polyimide films, polyamide films, aromatic polyamide films and polyester films. The only requirement for the silicone material is that the cured material be capable of bonding to a substrate such as metal, ceramic or glass when heated in contact with these substrates.

One class of useful silicone materials are principally composed of a vinyl-containing polyorganosiloxane, a polyorganohydrogensiloxane, an adhesion promoter and a platinum compound catalyst. Examples of suitable adhesion promoters include vinyltrialkoxysilane, allyltrialkoxysilane, γ-methacryloxypropyltrialkoxysilane, γ-glycidoxypropyltrialkoxysilane, trialkoxysilane and vinyltri(isopropenoxy)silane. A second class of silicone materials are principally composed of a vinyl-containing polyorganosiloxane, a polyorganohydrogensiloxane and a platinum compound catalyst. This latter class of materials contains a large excess of silicon-bonded hydrogen relative to silicon-bonded vinyl groups, and has been cured on the heat-resistant dielectric resin film.

The heat-resistant dielectric resin film laminated with a cured heat-activated silicone adhesive can be a tape applied in the shape of an "L", a "U", a rectangular frame, a square frame, a rectangular sheet or a square sheet. All of the inner leads can be adhered to a single strip or sheet of heat-resistant dielectric resin film. Alternatively, all the inner leads are adhered, but as two or more groups using multiple pieces of dielectric film, or only the longer inner leads are adhered to the dielectric film. In an alternative embodiment the film may cover the tips of the inner leads and either the perimeter of the tab or the entire surface of the tab. The heat-resistant resin film can be bonded to one side or to both sides of the inner leads.

The following example describes preferred embodiments of this invention. The example should not be interpreted as limiting the scope of the invention defined in the accompanying claims. All parts and percentages in the example are by weight.

FIG. 1 of the accompanying drawings shows the design of a lead frame for semiconductor devices that represents one embodiment of the present invention. Rectangular tab 2 for mounting a semiconductor device is supported by two support members 3 which extend from the lead frame main body 1. Fourteen inner leads 4 are arranged on the circumference of tab 2 so that the tips of the inner leads encircle tab 2. The other ends of inner leads 4 form outer lead terminals 5 in a continuous manner.

All of the inner leads 4 are adhered to a rectangular frame formed by a strip of heat-resistant resin film laminated with cured heat-activated silicone adhesive. The perimeter of the frame contacts all of the inner leads at their mid point.

The heat-activated silicone adhesive was prepared by blending together 97 parts of a dimethylvinylsiloxy terminated polydimethylsiloxane exhibiting a viscosity of $2 \times 10^{-3}$ m²/sec. at 25° C., 2.0 parts trimethyl-terminated polymethylhydrogensiloxane with a viscosity of $1 \times 10^{-5}$ m²/sec. at 25° C., 0.001 part chloroplatinic acid and 3.0 parts vinyltrimethoxysilane. This composition was coated on one surface of polyimide film 6a and then cured at 100° C. for 5 minutes to form coated film 6. The cured silicone material was tightly bonded to the polyimide film.

Figure 2:
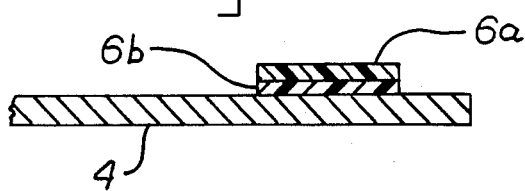
FIG. 2 is a magnified partial crosssection along line I—I of FIG. 1.

As depicted in FIG. 2, the heat-resistant dielectric resin film 6 was tightly bonded to the surfaces of inner leads 4 by bringing the side with the cured heat-activated silicone adhesive into contact with the surfaces of inner leads 4, and then heating at 100° C. for 30 minutes. Inner lead 4 was 200 μm thick and the layer of cured heat-activated silicone adhesive 6b was 30 μm thick.

The problems associated with the prior art do not occur when semiconductor devices are assembled using the above-described lead frame.

Because the tips of inner leads 4 were stably held in place, bonding to the chip with fine gold wire was easily conducted and bonding misses and bonding openings after bondings were prevented. In addition, because a cured heat-activated silicone adhesive is used as the adhesive medium, the wire bonding portion at the tip of inner leads 4 will not be contaminated, unlike the situation with the prior art liquid adhesives. When cured silicone adhesive medium was exposed to temperatures of from 400° to 500° C. during die bonding or wire bonding of the silicon semiconductor chip, slipping or loosening of the film at the adhesion surface did not occur, in contrast to prior art pressure-sensitive adhesives, and the relative positions of the inner leads remained fixed.

Figure 3:
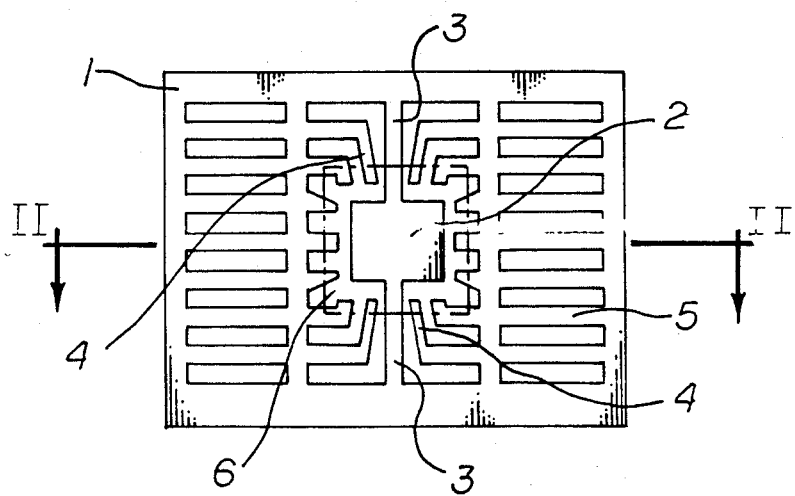
FIG. 3 is a top view of a lead frame that represents another embodiment of the present invention.

FIG. 3 depicts another embodiment of the present lead frame.

A rectangular tab 2 for mounting the semiconductor chip is supported by two supporting members 3 which extend from the lead frame main body 1. Fourteen inner leads 4 originate from the main body and extend inwardly to the area adjacent to the circumference of tab 2 and encircle the tab. The other ends of inner leads 4 form outer lead terminals 5 in a continuous manner.

The tips of all inner leads 4 and tab 2 are adhered to a rectangular piece of resin film laminated with a cured heat-activated silicone adhesive 6. The film is bonded to both the back surfaces of the tips of inner leads 4 and the back surface of tab 2.

The heat-resistant resin film laminated with cured heat-activated silicone adhesive 6 was produced as follows. An addition-curing polyorganosiloxane composition was prepared by blending 97 parts of a dimethylvinyl terminated polydiorganosiloxane exhibiting a viscosity of $5 \times 10^{-3}$ m²/sec. at 25° C., 1.5 parts of a trimethylsiloxy terminated polymethylhydrogensiloxane exhibiting a viscosity of $1 \times 10^{-5}$ m²/sec. at 25° C., 0.001 part of chloroplatinic acid and 3.0 parts of γ-methacryloxypropyltrimethoxysilane. The resultant composition was coated on one surface of a polyethylene terephthalate film 6c and then cured at 100° C. for 5 minutes. The cured heat-activated silicone was then tightly bonded to the polyethylene terephthalate film.

Figure 4:
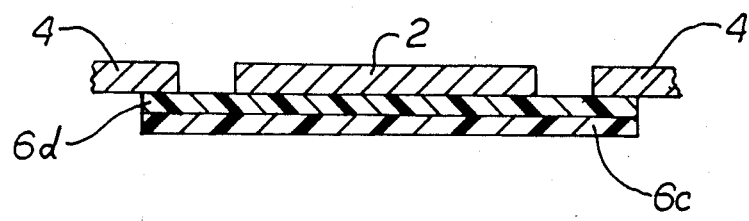
FIG. 4 is a magnified view partial crosssectional view along line II—II of FIG. 3.

As shown in FIG. 4, the heat-resistant resin film 6 has been tightly bonded to the back surfaces of the tips of inner leads 4 and the back surface of tab 2 by contacting the cured heat-activated silicone adhesive 6d with both the back surfaces of the tips of inner leads 4 and the back surface of tab 2 and then heating at 100° C. for 30 minutes. Tab 2 and inner lead 4 were both 200 μm thick, the polyethylene terephthalate film 6c was 50 μm thick and the layer of cured heat-activated silicone adhesive 6d was 50 μm thick.

The problems described hereinabove for the prior art lead frames do not occur when devices are assembled using the lead frame of this invention depicted in FIG. 5.

Because the tips of inner leads 4 are held in place by the film and silicone adhesive, bonding to the chip using fine gold wire can be easily conducted and bonding misses and bonding openings after wire bondings are prevented.

Because a cured heat-activated silicone adhesive is used as the adhesive medium, the wire bonding portion located at the tips of inner leads 4 is not contaminated, in contrast to the use of previous liquid adhesives. When the adhesive medium of this invention was exposed to temperatures of from 400° to 500° C. that are typically used in die bonding or wire bonding the silicon semiconductor chip, slipping or loosening of the film at the adhesion surface did not occur, in contrast to prior pressure-sensitive adhesives, so no movement on the part of inner lead 4 occured.

Figure 5:
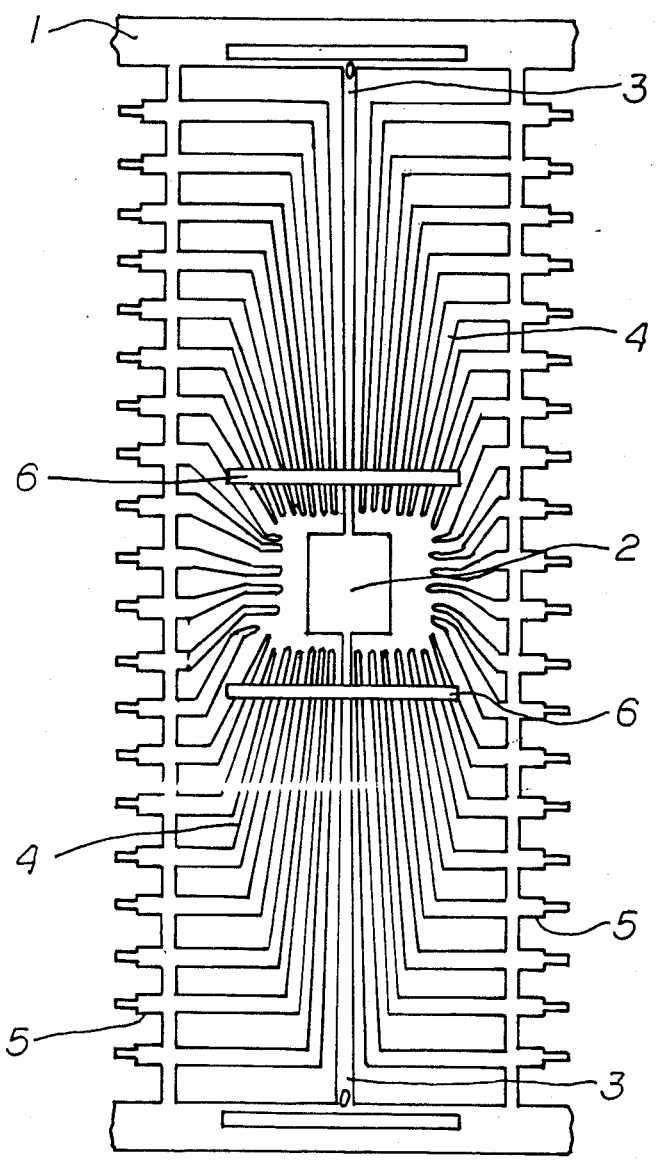
FIG. 5 is a top view of a lead frame that represents a third embodiment of the present invention.

FIG. 5 shows the design of the essential elements of a lead frame for semiconductor devices which represents yet another embodiment of the present invention.

A rectangular tab 2 for mounting the semiconductor chip is supported by two tab support members 3 which extend from the lead frame main body 1. Forty inner leads 4 are arranged around the perimeter of tab 2 in such a way that the tips of these inner leads encircle, but do not contact, tab 2. The other ends of these inner leads 4 form outer lead terminals 5 in a continuous manner. Of the forty inner leads 4, the seven inner leads 4 on one side of each of the two tab support members, the seven inner leads on the other side of each tab support member and the support member itself are adhered to a strip of heat-resistant resin film laminated with cured heat-activated silicone adhesive 6. The heat-resistant resin film laminated with cured heat-activated silicone adhesive 6 should be placed as near the tip as possible in order to most effectively stabilize the position of the tip of the inner lead 4, but should be slightly displaced from the tip toward the rear since the tip is to be bonded with wire.

The heat-resistant resin film laminated with cured heat-activated silicone adhesive 6 was produced as follows. An addition-curing organopolysiloxane composition was prepared by blending 97.5 parts of a dimethylvinylsiloxy terminated polydimethylsiloxane exhibiting a viscosity of $2 \times 10^{-3} m^2$/second at 25° C., 2.5 parts of a trimethylsiloxy endblocked polymethylhydrogensiloxane exhibiting a viscosity of $1 \times 10^{-5} m^2$/sec. at 25° C. (equivalent to 5 silicon-bonded hydrogens per vinyl radical), and 0.001 part chloroplatinic acid. The resultant composition was coated on one surface of an aromatic polyamide film and then cured at 120° C. for 5 minutes. The cured silicone composition was tightly bonded to the aromatic polyamide film.

The heat-resistant resin film 6 was tightly bonded to both the surfaces of tab support members and the surfaces of inner leads 4 by bringing the side with the cured heat-activated silicone adhesive into contact with both the tab support member 3 and the surface of inner leads 4 and then heating at 100° C. for 30 minutes. Tab 2, tab support members 3 and inner leads 4 were all 300 μm thick, the aromatic polyamide film was 100 μm thick and the layer of cured heat-activated silicone adhesive was 50 μm thick. The problems associated with prior art lead frames did not arise when a semiconductor device was assembled using the lead frame of FIG. 5.

Because the tips of the longest of the inner leads 4 were stably held in place, bonding to the chip with fine gold wire was easily conducted and bonding misses and bonding failures after bonding were both prevented.

Because a cured heat-activated silicone adhesive was employed as the adhesive medium, the wire bonding parts at the tips of inner leads 4 were not contaminated, in contrast to prior liquid adhesives. When this adhesive medium was exposed to temperatures of from 400° to 500° C. in die bonding or wire bonding of the silicon semiconductor chip, slipping or loosening at the adhesion surface did not occur, in contrast to prior adhesives, so the positioning of inner lead 4 remained stable.

Because a heat-resistant resin film laminated with a cured heat-activated silicone adhesive is used to secure the inner leads to each other, or to secure the tips of the inner leads to the tab, the tips of the inner leads are stably maintained in place. As a result, wire bonding is easily conducted and bonding misses and bonding openings after bonding are prevented. Unlike previous liquid adhesives, said heat-resistant resin film laminated with a cured heat-activated silicone adhesive is not squeezed out and so does not contaminate the tip portion of the lead used for wire bonding. Unlike previous pressure-sensitive adhesives, when said heat-resistant resin film laminated with cured heat-activated silicone adhesive is exposed to the elevated temperatures used for die bonding or wire bonding, the adhesive does not slip or loosen at the adhesion surface and so does not cause any shifting or bending of the inner lead.

The present invention thereby significantly contributes to increasing the rate of production and reliability of semiconductor devices.

The present lead frames are suitable for resin-sealed, ceramic-sealed and solder-dipped semiconductor devices and particularly for semiconductor integrated circuit devices.

That which is claimed is:

1. A lead frame for a semiconductor device comprising a mounting tab for a semiconductor chip located within the body of said frame, at least one supporting member extending from the perimeter of said tab to the perimeter of said frame, a plurality of inner leads extending from the body of said frame inwardly to the area immediately adjacent to the perimeter of said tab, and means for stabilizing the configuration of said inner leads with respect to one another and with respect to said tab during installation of said chip, said means consisting essentially of a heat resistant, dielectric film that is bonded to at least a portion of said inner leads or to the tips of said leads and said tab by a heat cured silicone adhesive comprising a vinyl-containing polyorganosiloxane, a polyorganohydrogensiloxane and a platinum compound catalyst.

2. A lead frame according to claim 1 where said film is in the form of a tape or a sheet that is adhered to all of said inner leads.

3. A lead frame according to claim 2 where said film is a tape forming a square or rectangular frame.

4. A lead frame according to claim 1 where said film is a tape that is adhered to a portion of said inner leads.

5. A lead frame according to claim 2 where said film is a sheet that is adhered to all of said inner leads and said tab.

6. A lead frame according to claim 3 where said film is a polyimide, a polyamide, an aromatic polyamide or a polyester.

7. A lead frame according to claim 1 where said polyorganosiloxane is a polydiorganosiloxane and said silicone adhesive contains vinyltrimethoxysilane or gamma-methacryloxypropyltrimethoxysilane as an adhesion promoter.

8. A lead frame according to claim 1 where said silicone adhesive contains a stoichiometric excess of silicon-bonded hydrogen atoms relative to vinyl radicals.

9. A lead frame according to claim 6 where said polyester is polyethylene terephthalate.

* * * * *